United States Patent [19]
Lin et al.

[11] Patent Number: 6,033,232
[45] Date of Patent: Mar. 7, 2000

[54] PROCESS OF FABRICATING PHOTODIODE INTEGRATED WITH MOS DEVICE

[75] Inventors: James H. C. Lin; Chih-Wei Hsiung, both of Hsin-Chu, Taiwan

[73] Assignee: Powerchip Semiconductor Corp., Taiwan, China

[21] Appl. No.: 09/172,037

[22] Filed: Oct. 14, 1998

[51] Int. Cl.[7] ............................................. H01L 21/8234
[52] U.S. Cl. .................... 437/237; 438/23; 438/200; 438/275; 438/303; 438/305; 148/DIG. 72
[58] Field of Search ................................... 438/275, 303, 438/305, 59, 123, 200, 234, 237; 148/DIG. 72

[56] References Cited

U.S. PATENT DOCUMENTS

| | | | |
|---|---|---|---|
| 4,791,070 | 12/1988 | Hirao et al. | 437/2 |
| 4,889,826 | 12/1989 | Ohta | 437/40 |
| 5,268,309 | 12/1993 | Mizutani et al. | 437/3 |
| 5,786,247 | 7/1998 | Chang et al. | 438/231 |

FOREIGN PATENT DOCUMENTS 363122267  5/1988  Japan .
403091959  4/1991  Japan .
405003311  1/1993  Japan .

*Primary Examiner*—Wael Fahmy
*Assistant Examiner*—Long Pham
*Attorney, Agent, or Firm*—Finnegan, Henderson, Farabow, Garrett & Dunner, L.L.P.

[57] ABSTRACT

A method of fabricating a photodiode and at least one MOS device within a first active region and a second active region, respectively, of a substrate is disclosed. First, a gate structure is formed on the substrate within the second active region, and lightly-doped regions are formed by introducing first dopants into the substrate through the gate structure as masking. Then, a diffusion region is formed in the substrate within the first active region by ion implantation. Then, an insulating layer is formed to overlie the first and second active region, a portion of which within the second active region is thereafter patterned to sidewall spacers on the sidewalls of the gate structure. Subsequently, heavily-doped regions are formed by introducing second dopants throughout the second active region into the substrate by the gate structure and sidewall spacers as masking. In addition, the insulating layer can be thinned before the step of patterning the insulating layer to form the sidewall spacers is performed.

6 Claims, 6 Drawing Sheets

PROCESS OF FABRICATING PHOTODIODE INTEGRATED WITH MOS DEVICE

BACKGROUND OF THE INVENTION

1. Field of the Invention

The present invention relates to semiconductor integrated circuit fabrication. More particularly, the present invention relates to a method of fabricating a photodiode integrated with MOS devices.

2. Description of the Related Art

FIGS. 1A–1H are cross-sectional diagrams schematically illustrating a series of conventional process steps used to fabricate a photodiode, an NMOS transistor and a PMOS transistor, which are all integrated together onto a semiconductor substrate 100. Above the semiconductor substrate 100, three active regions 10–12 are defined for the arrangement of the photodiode, NMOS transistor and PMOS transistor, respectively. In the drawings, three well regions 100A, 100B and 100C are formed in the semiconductor substrate 100 within the respective active regions 10, 11 and 12. Note that the well regions 100A and 100B are P-wells and the well region 100C is an N-well.

As shown in FIG. 1A, a gate insulator 101 is formed along the entire surface of the semiconductor substrate 100 and then three gates 102, 103 and 104 are deposited above the gate insulator 101 but positioned within the active regions 10, 11 and 12, respectively. Next, the active region 12 is masked with a photoresist layer 105, and then N-type dopants 106 are introduced by ion implantation throughout the active regions 10 and 11, but not under the gates 102 and 103, so as to form N-type lightly-doped regions 107 and 108, as shown in FIG. 1B. Accordingly, a P/N junction is constructed between the well region 100A and the N-type doped region 107 to be the photodiode. The photoresist layer 105 is thereafter removed.

Referring to FIG. 1C, the active regions 10 and 11 are masked with a photoresist layer 109, and P-type dopants 110 are introduced by ion implantation throughout the active region 12, but not under the gate 104, to form P-type lightly-doped regions 111. Next, as shown in FIG. 1D, an insulating layer 112 is conformably deposited over the entire surface of the substrate 100. Then, the insulating layer 115 is etched back to sidewall spacers 113, 114 and 115 on the sidewalls of the gates 102, 103 and 104, respectively. The resulting cross-sectional view is FIG. 1E.

Then, the active regions 10 and 12 are masked by a photoresist layer 116 as shown in FIG. 1E Subsequently, N-type dopants 117 are introduced by ion implantation throughout the active region 11, but not under the gate 103 or the sidewall spacers 114, therefore to form N-type heavily-doped regions 118 while merging with a portion of the N-type lightly-doped regions 108. The photoresist layer 116 is thereafter removed.

Next, the active regions 10 and 11 are masked by a photoresist layer 119 as shown in FIG. 1G. Subsequently, P-type dopants 120 are introduced by ion implantation throughout the third active region 12, but not under the gate 104 or the sidewall spacers 115, to form P-type heavily-doped regions 121 while merging with a portion of the P-type doped regions 111. The photoresist layer 119 is thereafter removed and the resulting cross-sectional view is FIG. 1H.

However, the doping concentration of the doped regions 107, which constitute the cathode of the photodiode, is determined in the formation of the light-doped regions 108 for the NMOS transistor. Thus, the prior art is useful only in the circumstance that the required doping concentrations for the doped regions 107 and 108 are substantially the same. Moreover, while converting the insulating layer 112 to the sidewall spacers 113–115, the surface of the doped regions 107 would suffer from etching damage and therefore increase the junction leakage current for the photodiode.

SUMMARY OF THE INVENTION

Therefore, it is an object of the present invention to provide a method of fabricating a photodiode integrated with MOS devices in which the doping concentration can be adjusted, thus controlling photodiode characteristics more accurately.

It is another object of the present invention to provide a method of fabricating a photodiode integrated with MOS devices that can prevent etching damage to the photodiode, thus avoiding an increase of leakage current.

The present invention achieves the above-indicated objects by providing a method of fabricating a photodiode and at least one MOS device within a first active region and a second active region, respectively, of a substrate. First, a gate structure is formed on the substrate within the second active region, and lightly-doped regions are formed by introducing first dopants into the substrate through the gate structure as masking. Then, a diffusion region is formed in the substrate within the first active region by ion implantation. Then, an insulating layer is formed to overlie the first and second active region, and a portion of which within the second active region is thereafter patterned to sidewall spacers on the sidewalls of the gate structure. Subsequently, heavily-doped regions are formed by introducing second dopants throughout the second active region into the substrate by the gate structure and sidewall spacers as masking.

Moreover, the insulating layer can be thinned before the step of patterning the insulating layer to form the sidewall spacers is performed.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

The preferred embodiment of the present invention is illustrated in FIGS. 2A–2I of the drawings, like numerals being used to refer to the same or similar parts of the various drawings. FIGS. 2A–2I illustrate cross-sectional side views of the preferred embodiment in accordance with the present invention throughout various processing steps.

Figure 1A:
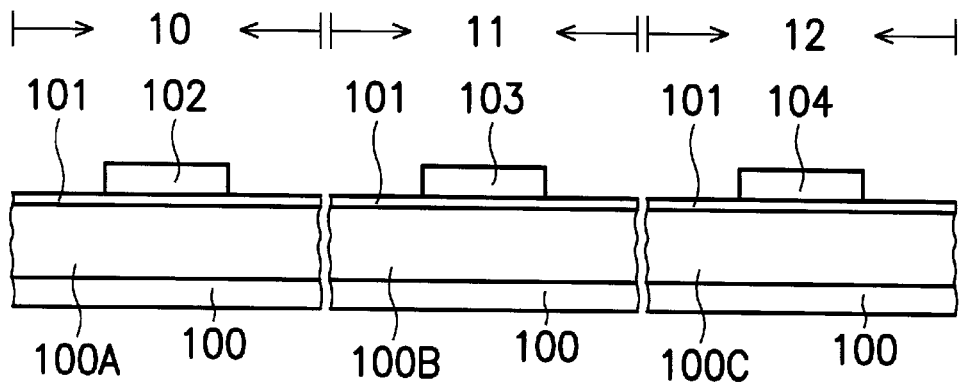
FIGS. 1A–1H are cross-sectional diagrams schematically illustrating a series of conventional process steps used to fabricate a photodiode, an NMOS transistor and a PMOS transistor.
Figure 1B:
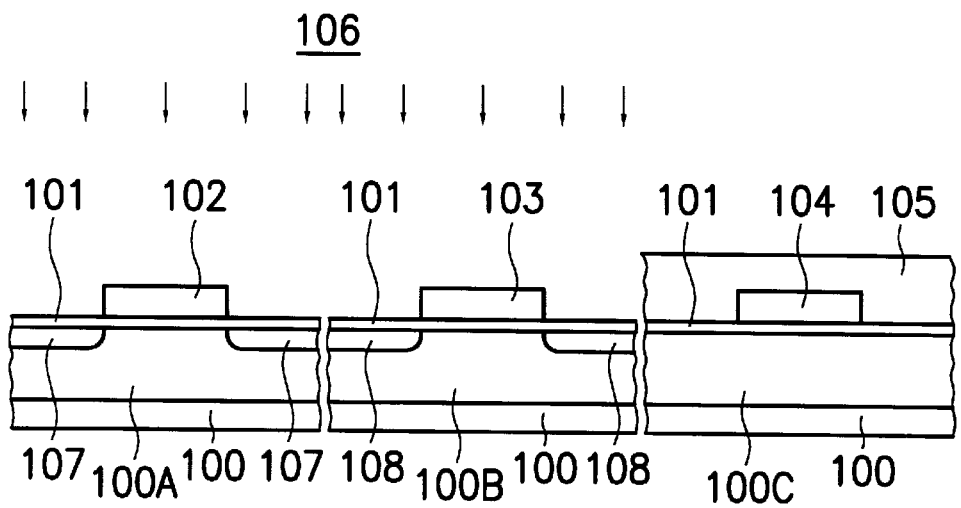
Figure 1C:
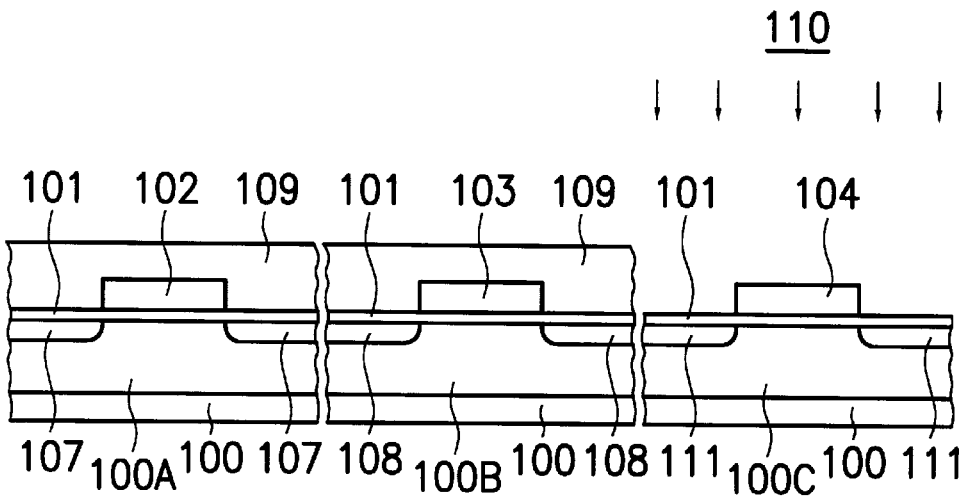
Figure 1D:
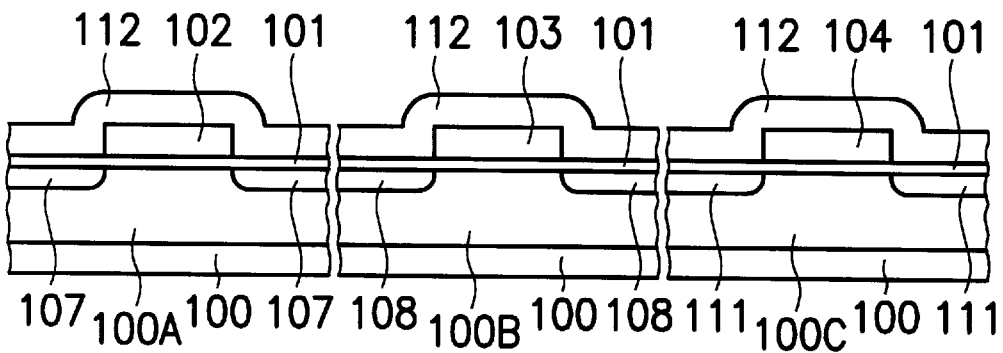
Figure 1E:
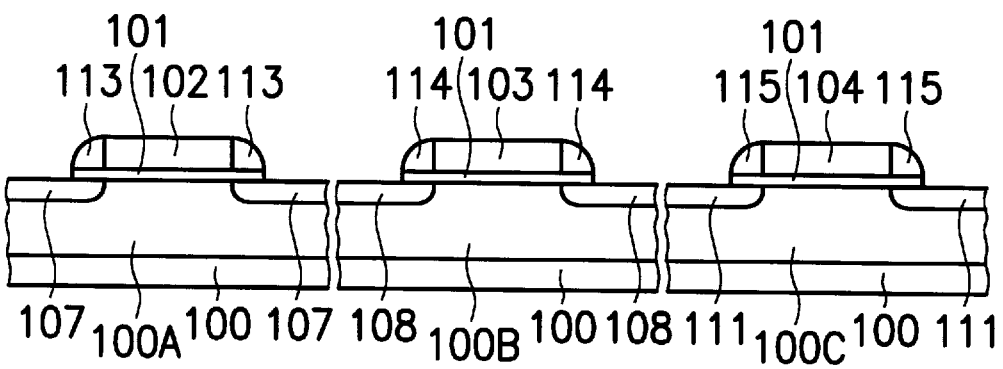
Figure 1F:
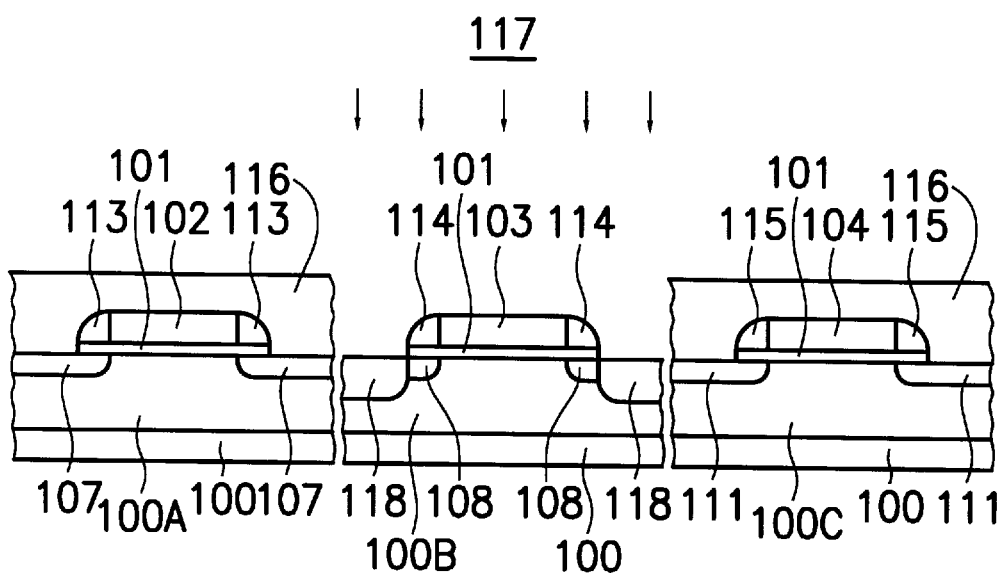
Figure 1G:
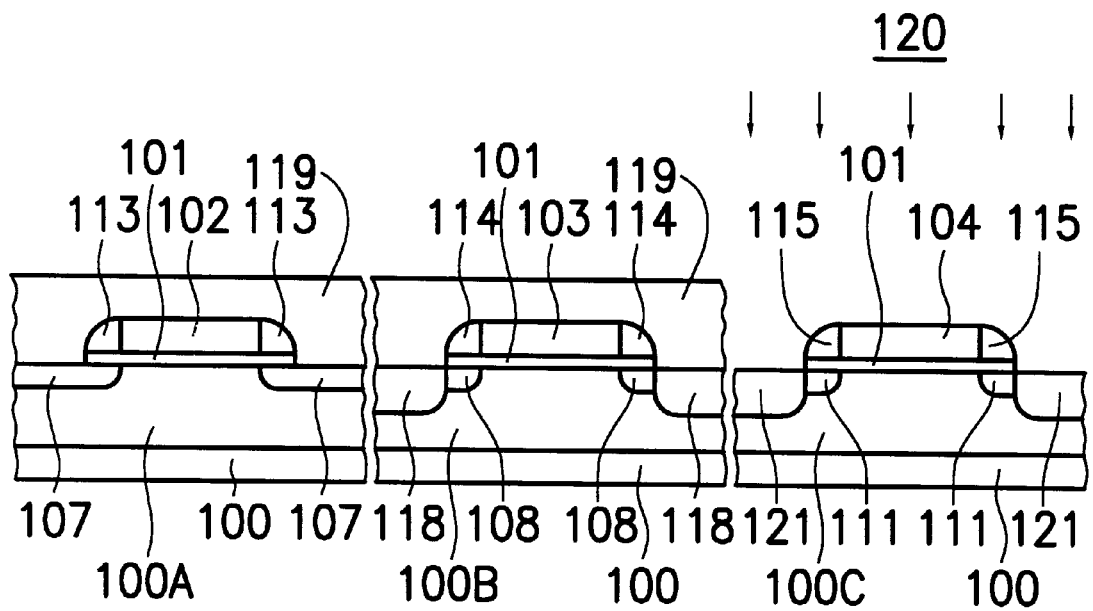
Figure 1H:
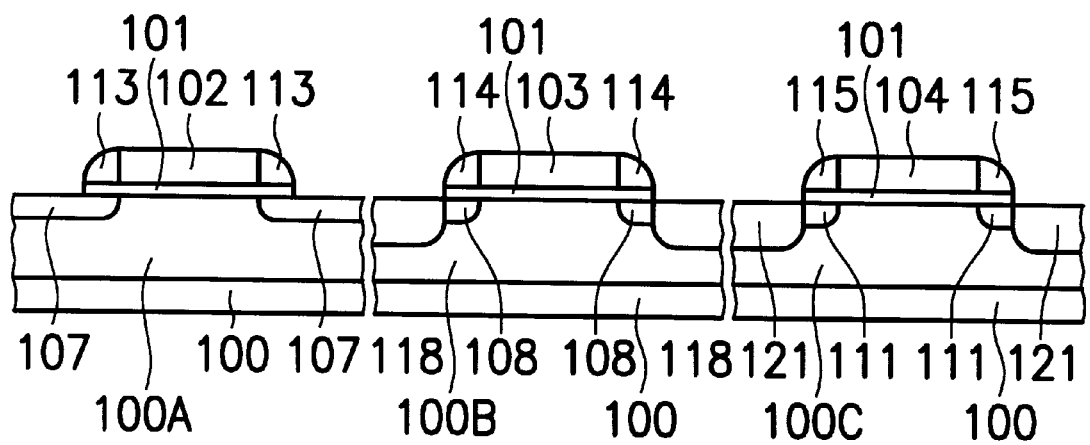
Figure 2A:
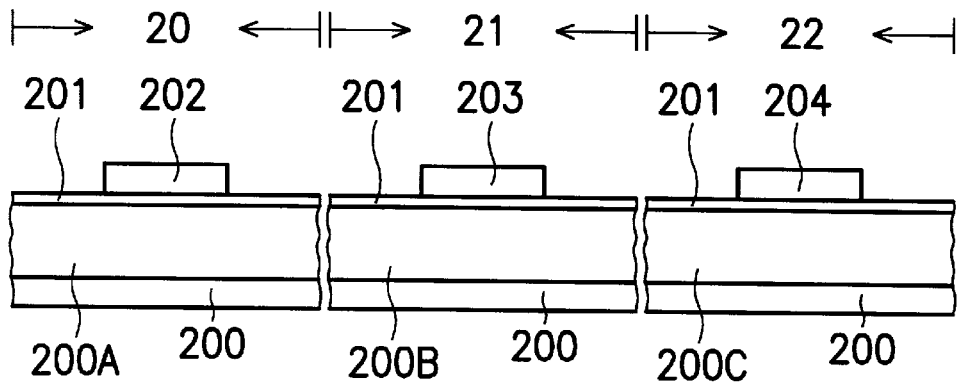
FIGS. 2A–2I are cross-sectional diagrams schematically illustrating a series of process steps for fabricating a photodiode, an NMOS transistor and a PMOS transistor in accordance with one preferred embodiment of the present invention.

FIG. 2A shows a semiconductor substrate 200 comprising a photodiode, an NMOS transistor, and a PMOS transistor to be fabricated within a first active region 20, a second active region 21 and a third active region 22, respectively. In the drawing, three well regions 200A, 200B and 200C are formed in the semiconductor substrate 200 within the respective active regions 20, 21 and 22. That the well regions 200A and 200B are P-wells and the well region 200C is an N-well is exemplified in the preferred embodiment, but it is not intended to limit the invention thereto. Normally, insulating regions (not shown in the drawing) are utilized to isolate those devices therebetween. Typically, the insulating regions can be formed by growing field oxides on the semiconductor substrate 200, which is masked by patterned layers such as silicon nitride to prevent oxidation over the active regions 20–22 when the semiconductor substrate 200 is made of single crystalline silicon.

As shown in FIG. 2A, a gate insulator 201 is formed along the entire surface of the semiconductor substrate 200, typically grown to a thickness of 50–200Å. Three gates 202, 203 and 204 are deposited above the gate insulator 201 but positioned within the first active region 20, the second active region 21 and the third active region 22, respectively. Typically, the gates 202–204 comprise a heavily-doped polysilicon layer of about 800–1500Å in thickness and a tungsten silicide layer of about 500–1200Å in thickness, both of which are etched to the desired gate configuration.

Figure 2B:
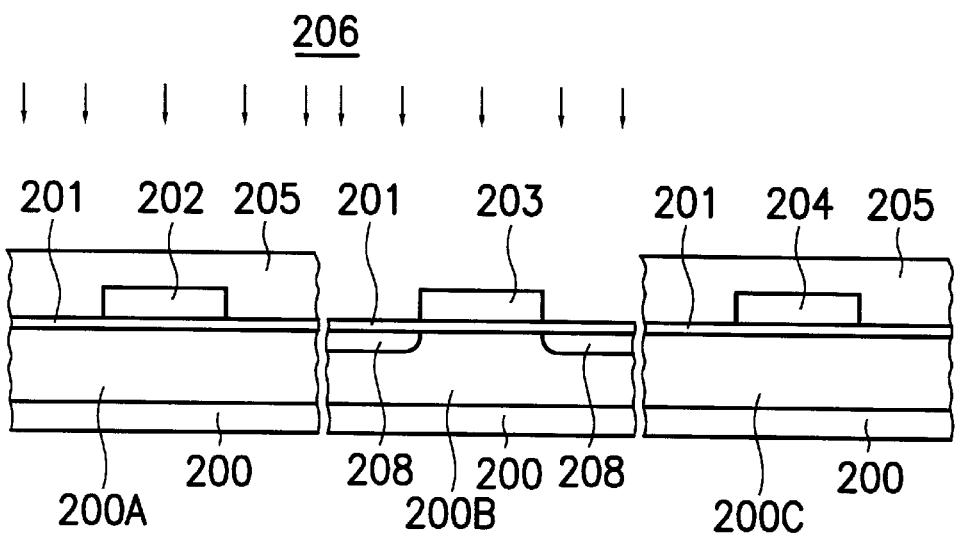

Referring next to FIG. 2B, the first active region 20 and third active region 22 are masked with a first photoresist layer 205, and then N-type dopants 206 are introduced by ion implantation throughout the second active region 21, but not under the gate 203, so as to form N-type lightly-doped regions 208. For the NMOS transistor, the chemical species of the dopants 206 implanted may be phosphorus (P) with a dose within an operable range of between about $5 \times 10^{12} cm^{-2}$ and about $5 \times 10^{13} cm^{-2}$ at an energy of between about 20 KeV and about 40 KeV. The first photoresist layer 205 is thereafter removed.

Figure 2C:
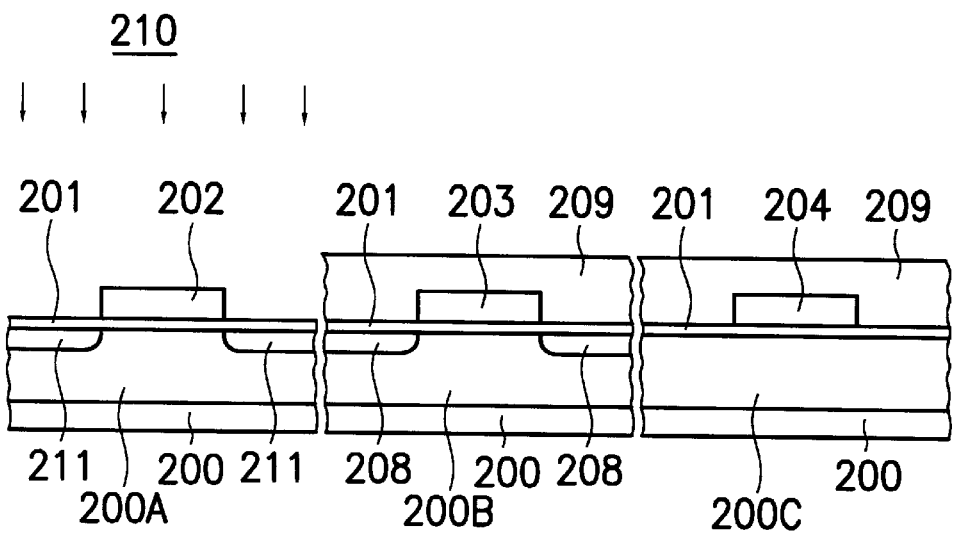

As shown in FIG. 2C, the active regions 21 and 22 are masked with a second photoresist layer 209. Subsequently, N-type dopants 210 are introduced by ion implantation throughout the first active region 20, but not under the gate 202, to form N-type doped regions 211. For the photodiode, the chemical species of the dopants 210 implanted may be arsenic (As) with a dose within an operable range of between about $1 \times 10^{13} cm^{-2}$ and about $1 \times 10^{14} cm^{-2}$ at an energy of between about 100 KeV and about 150 KeV, or phosphorus (P) with a dose within an operable range of between about $1 \times 10^{13} cm^{-2}$ and about $1 \times 10^{14} cm^{-2}$ at an energy of between about 50 KeV and about 100 KeV. According to the present invention, an additional implantation process as shown in FIG. 2C is employed to adjust the doping concentration of the N-type doped regions 211 and control photodiode characteristics more accurately. Then, the second photoresist layer 209 is removed.

Figure 2D:
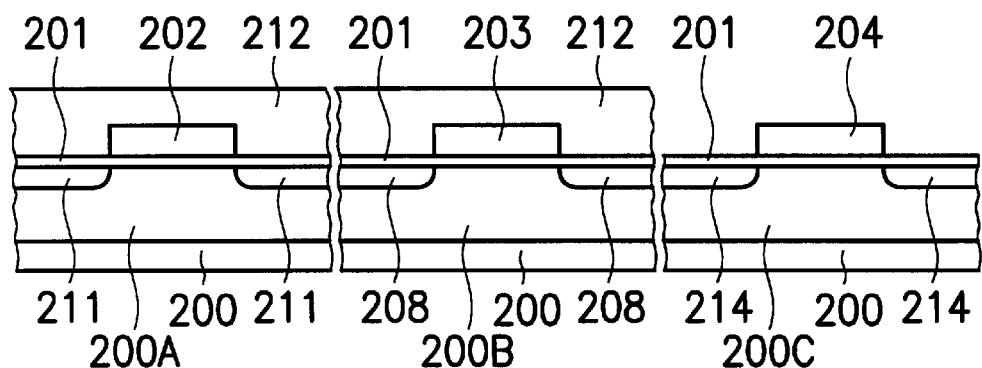

Referring to FIG. 2D, the active regions 20 and 21 are masked with a third photoresist layer 212, and P-type dopants 213 are introduced by ion implantation throughout the third active region 22, but not under the gate 204, to form P-type lightly-doped regions 214. For the PMOS transistor, the chemical species of the dopants 213 implanted may be $BF_2$ with a dose within an operable range of between about $1 \times 10^{13} cm^{-2}$ and about $1 \times 10^{14} cm^{-2}$ at an energy of between about 20 KeV and about 40 KeV. Afterwards, the third photoresist layer 212 is removed.

Figure 2E:
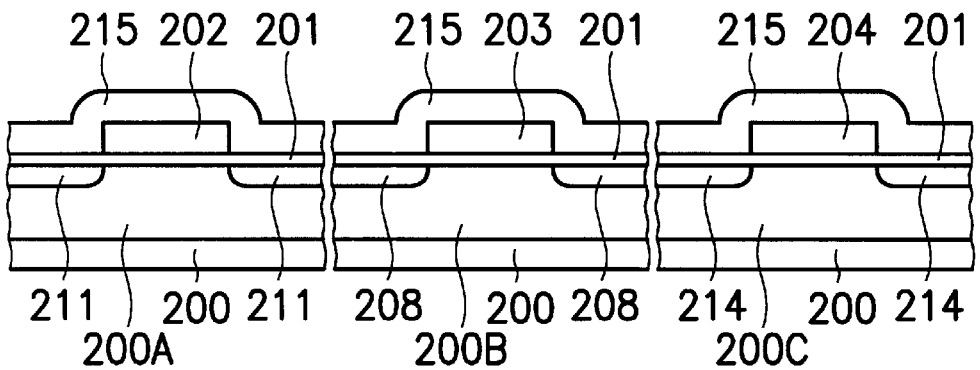
Figure 2F:
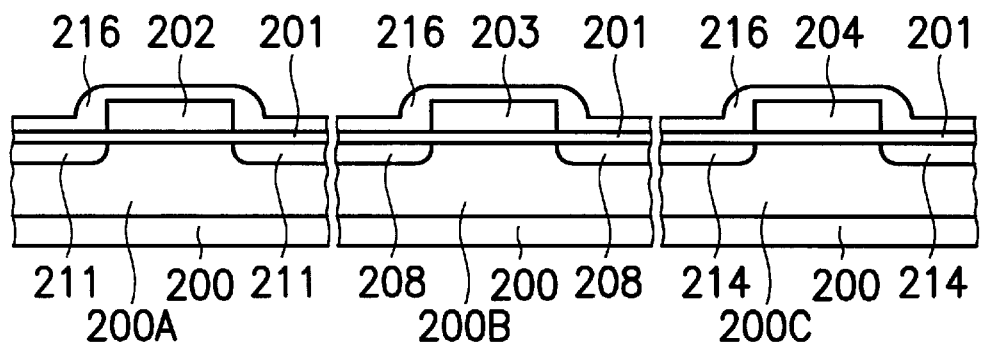

Next, as shown in FIG. 2E, an insulating layer 215 is conformably formed over the entire surface of the substrate 200. Preferably, the insulating layer 215 comprises silicon oxide deposited at 650° C. to 750° C. in an LPCVD (low-pressure chemical vapor deposition) reactor by decomposing TEOS (tetraethoxysilane) at a thickness of about 1000–1500Å. Optically, as depicted in FIG. 2F, the insulating layer 215 can be partially etched back to form a thinner insulating layer 216 having a thickness of between about 300Å and about 700Å in the case that poor surface morphology due to height difference raises an issue.

Figure 2G:
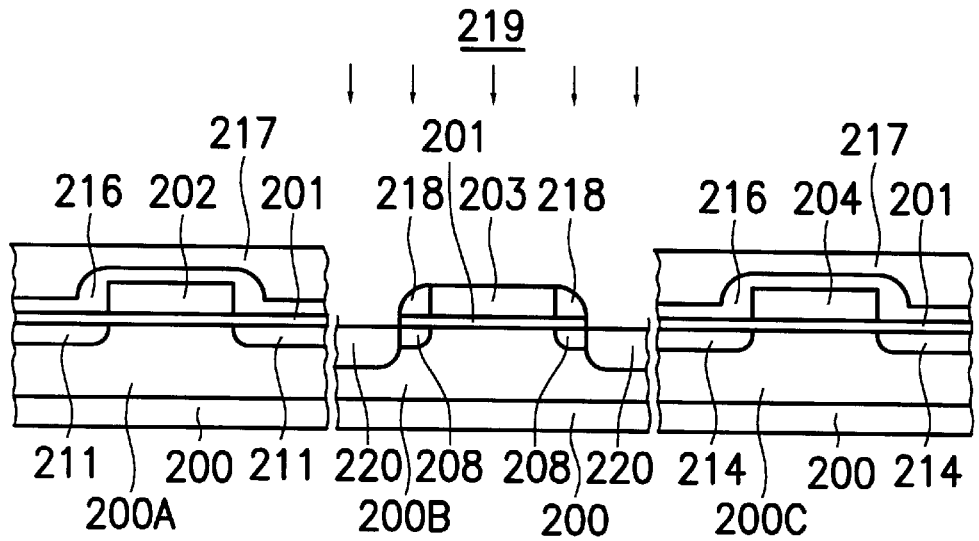

Then, the first active region 20 and the third active region 22 are masked by a fourth photoresist layer 217 as shown in FIG. 2G. Sidewall spacers 218 are formed on the sidewalls of the gate 203 by etching back a portion of the thinner insulating layer 216 %within the range of the second active region 21. Subsequently, N-type dopants 219 are introduced by ion implantation throughout the second active region 21, but not under the gate 203 or the sidewall spacers 218, to form N-type heavily-doped regions 220 while merging with a portion of the N-type lightly-doped regions 208. For the NMOS transistor, the chemical species of the dopants 219 implanted may be arsenic (As) with a dose within an operable range of between about $1 \times 10^{15} cm^{-2}$ and about $1 \times 10^{16} cm^{-2}$ at an energy of between about 30 KeV and about 70 KeV. The fourth photoresist layer 217 is thereafter removed.

Figure 2H:
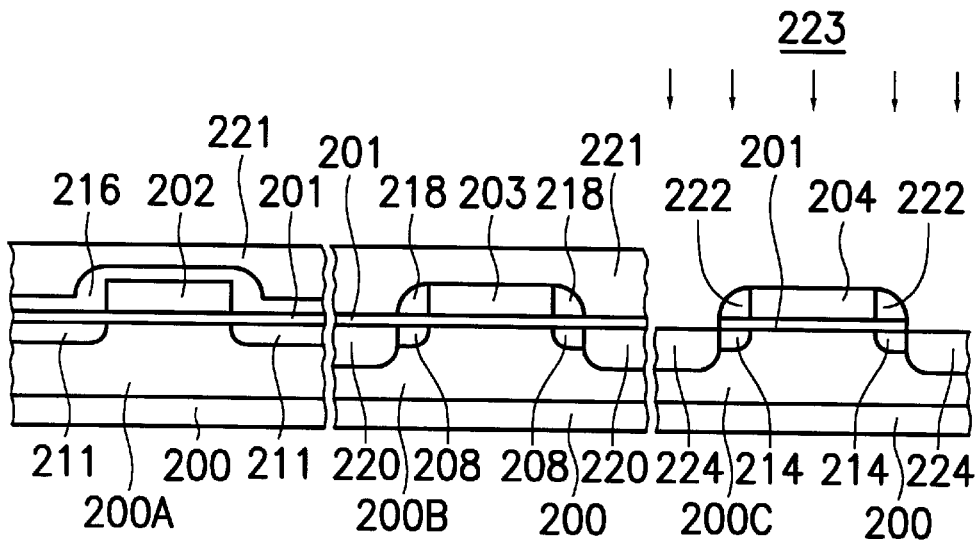
Figure 2I:
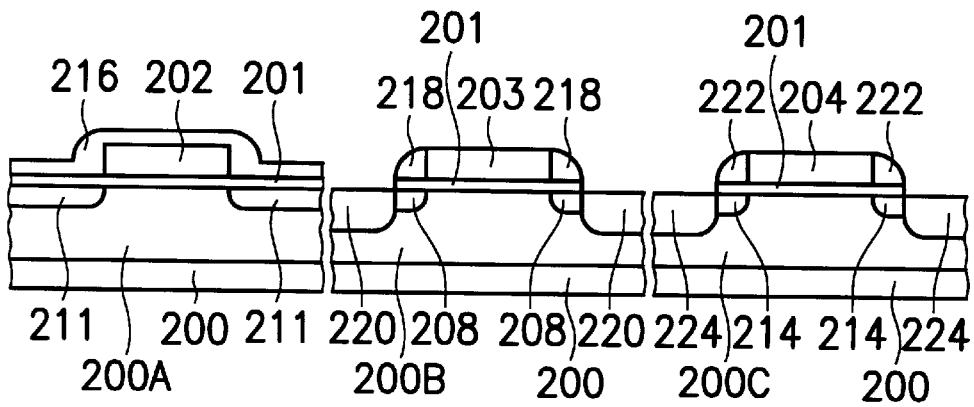

The first active region 20 and the second active region 21 is masked by a fifth photoresist layer 221 as shown in FIG. 2H. Sidewall spacers 222 are formed on the sidewalls of the gate 204 by etching back a portion of the thinner insulating layer 216 within the range of the third active region 22. Subsequently, P-type dopants 223 are introduced by ion implantation throughout the third active region 22, but not under the gate 204 and the sidewall spacers 222, to form P-type heavily-doped regions 224 while merging with a portion of the P-type doped regions 214. For the PMOS transistor, the chemical species of the dopants 223 implanted may be $BF_2$ with a dose within an operable range of between about $1 \times 10^{15} cm^{-2}$ and about $1 \times 10^{16} cm^{-2}$ at an energy of between about 10 KeV and about 30 KeV. The photoresist layer 221 is thereafter removed and the resulting cross-sectional view is FIG. 2I. Note that the thinner insulating layer 216 still remains within the range of the first active region 20, which can protect the surface of the N-type doped regions 211 from etching damage.

Consequently, in the method of making the photodiode integrated with the MOS devices in accordance with the present invention, doping concentration of the doped regions 211 is adjusted through the additional implantation process so as to control photodiode characteristics more accurately. Furthermore, the thinner insulating layer 216 is employed to cover the first active region 20, which can protect the surface of the N-type doped regions 211 from etching damage during the subsequent steps of forming the sidewall spacers for the MOS devices. Accordingly, the photodiode is protected from etching damage and an increase of junction leakage current is avoided.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method of fabricating a photodiode, a first MOS device and a second MOS device within a first active region, a second active region and a third active region, respectively, of a substrate, comprising the following steps of:

(a) forming a first gate structure and second gate structure on said substrate within said second active region and said third active region, respectively;

(b) forming first lightly-doped regions by introducing first dopants into said substrate throughout said second active region by said first gate structure as masking;

(c) forming a diffusion region in said substrate within said first active region;

(d) forming second lightly-doped regions by introducing second dopants into said substrate throughout said third active region by said second gate structure as masking;

(e) forming an insulating layer overlying said first, second and third active regions;

(f) thinning said insulating layer;

(g) patterning one portion of said insulating layer within said second active region to first sidewall spacers on the sidewalls of said first gate structure;

(h) forming first heavily-doped regions by introducing third dopants throughout said second active region into said substrate by said first gate structure and said first sidewall spacers as masking;

(i) patterning another portion of said insulating layer within said third active region to second sidewall spacers on the sidewalls of said second gate structure; and (j) forming second heavily-doped regions by introducing fourth dopants throughout said third active region into said substrate by said second gate structure and said second sidewall spacers as masking.

2. The method as claimed in claim 1, wherein said insulating layer comprises silicon oxide at a thickness of about 1000–1500Å.

3. The method as claimed in claim 1, wherein said thinned insulating layer has a thickness of about 300–700Å.

4. The method as claimed in claim 1, wherein said gate structures comprises a gate and a gate insulator.

5. The method as claimed in claim 1, wherein in step (a) further comprises the step of forming a third gate structure on said substrate within said first active region.

6. The method as claimed in claim 5, wherein in step (b) said first dopants are introduced throughout said first and second active regions by said third and first gate structures as masking.

* * * * *